(12) United States Patent
Lee

(10) Patent No.: US 8,071,971 B2
(45) Date of Patent: Dec. 6, 2011

(54) SEMICONDUCTOR DEVICE INCLUDING AIR GAP

(75) Inventor: Byung-Ho Lee, Gwangmyeong-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/608,055

(22) Filed: Oct. 29, 2009

(65) Prior Publication Data

US 2010/0108979 A1    May 6, 2010

(30) Foreign Application Priority Data

Nov. 5, 2008    (KR) ..................... 10-2008-0109294

(51) Int. Cl.
*H01L 45/00*     (2006.01)

(52) U.S. Cl. ..... 257/4; 257/214; 257/298; 257/E45.002; 257/E21.068; 438/102

(58) Field of Classification Search ........ 257/4, E45.002, 257/E21.068, 214, 298; 438/102
See application file for complete search history.

(56) References Cited

U.S. PATENT DOCUMENTS

| 2007/0236988 A1* | 10/2007 | Chen ............................. 365/163 |
| 2008/0096344 A1* | 4/2008 | Lai et al. ...................... 438/238 |
| 2008/0277642 A1* | 11/2008 | In T Zandt et al. ............... 257/4 |

* cited by examiner

*Primary Examiner* — Marc Armand
(74) *Attorney, Agent, or Firm* — Sherr & Vaughn, PLLC

(57) ABSTRACT

Embodiments relate to a semiconductor device, and more particularly, to a semiconductor device and a manufacturing method thereof that can reduce RC delay within the semiconductor device. Embodiments provide a semiconductor device including: a first interlayer dielectric layer formed over the a semiconductor substrate, a first metal wire and a second metal wire formed over the first interlayer dielectric layer, a second interlayer dielectric layer formed over the first and second metal wires, and a phase change material layer formed between the first and second metal wires.

10 Claims, 3 Drawing Sheets

SEMICONDUCTOR DEVICE INCLUDING AIR GAP

The present application claims priority under 35 U.S.C. 119 to Korean Patent Application No. 10-2008-0109294 (filed on Nov. 5, 2008), which is hereby incorporated by reference in its entirety.

BACKGROUND

With development of semiconductor technology, various types of problems are being generated. With microminiaturization of semiconductor devices, the requirements for the electrical properties of semiconductor devices are increasingly exacting, and new processes or design changes are required.

As semiconductor devices are downsized, one of the problems most notably appearing may be RC delay when an external electrical signal is transmitted to a transistor. The RC delay characteristics may be naturally generated during a process of manufacturing the semiconductor devices and as an example thereof, parasitic resistance or parasitic capacitance may be used. Parasitic resistance and parasitic capacitance are often inevitably generated in a semiconductor device using oxide and metal. Therefore, research for reducing parasitic resistance and parasitic capacitance is ongoing.

For example, as methods for solving the problem, a wiring process using copper (Cu) and processes using an ultra low-k material are being proposed. However, since the materials also have parasitic resistance and parasitic capacitance, they do not constitute a permanent solution.

Figure 1:
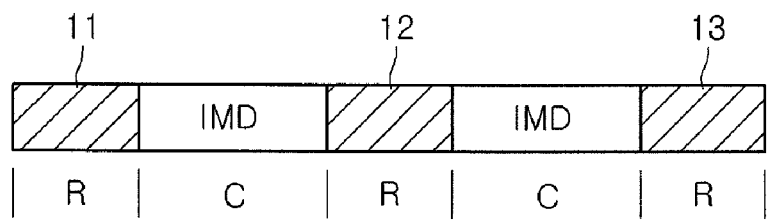
Figure 2:
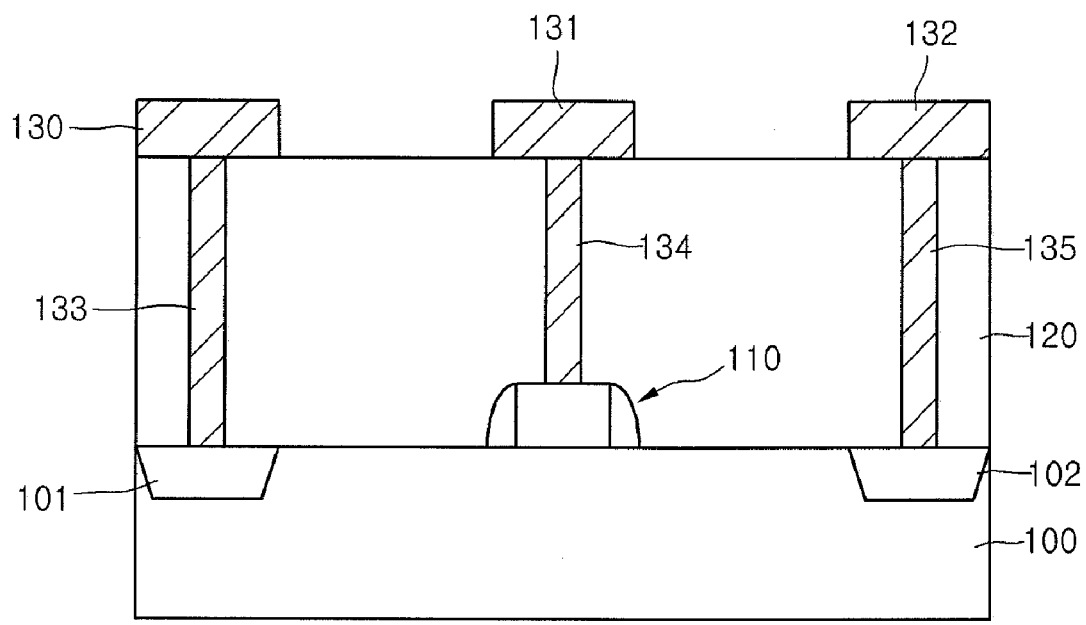

FIG. 1 is a diagram for describing RC delay in a semiconductor device. Referring to FIG. 1, a plurality of metal wires 11, 12, and 13 are formed on a predetermined layer and an IMD as an interlayer dielectric layer is formed between the metal wires.

In this case, during transmission of an electrical signal in the semiconductor device, the metal wires 11, 12, and 13 each show resistance characteristics, and the IMD shows capacitance characteristics. Accordingly, since resistance and capacitance are connected, the problem of a delayed transmission of the electrical signal persists.

SUMMARY

Embodiments relate to a semiconductor device, and more particularly, to a semiconductor device and a manufacturing method thereof that can reduce RC delay within the semiconductor device. A semiconductor device according to embodiments includes: a first interlayer dielectric layer formed over the a semiconductor substrate, a first metal wire and a second metal wire formed over the first interlayer dielectric layer, a second interlayer dielectric layer formed over the first and second metal wires, and a phase change material layer formed between the first and second metal wires.

A method for manufacturing a semiconductor device according to embodiments includes: forming a first interlayer dielectric layer over a semiconductor substrate, forming a plurality of metal wires over the first interlayer dielectric layer, depositing a phase change material over the first interlayer dielectric layer and the metal wire, forming a phase change material layer between the metal wires by planarizing the phase change material, forming a second interlayer dielectric layer over the phase change material layer and the metal wire, and performing a thermal process for inducing a change of a phase of the phase change material layer. Embodiments are contrived to solve the problem, and embodiments relate to a semiconductor device in which an air layer is formed between metal wires in order to reduce parasitic capacitance and a manufacturing method thereof.

By performing a thermal process for inducing a change of a phase of the phase change material after a phase change material is formed between the metal wires, a semiconductor device in which a predetermined air layer is formed between the metal wires and a manufacturing method thereof are provided.

DRAWINGS

FIG. 1 is a cross-sectional view for describing RC delay in a semiconductor device.

Example FIGS. 2 to 6 are cross-sectional views for describing a method for manufacturing a semiconductor device according to embodiments.

DESCRIPTION

Example FIGS. 2 to 6 are diagrams for describing a method for manufacturing a semiconductor device according to embodiments. First, referring to example FIG. 2, a first impurity region (i.e., source region) 101 and a second impurity region (i.e., drain region) are formed by performing a process of injecting impurities into a semiconductor substrate 100. A gate electrode 110 is formed over the semiconductor substrate 100.

Embodiments are not limited to the semiconductor device shown in the figure, but may be generally applied to semiconductor devices with metal wires and an interlayer dielectric layer. A process of forming the impurity regions 101 and 102 in the semiconductor substrate 100 and a process of forming a gate electrode 110 may be performed by various related technologies.

Meanwhile, a first interlayer dielectric layer 120 for interlayer isolation may be formed over the semiconductor substrate 100. A contact hole may be formed in the first interlayer dielectric layer 120. Contact plugs 133, 134, and 135 may be formed in the contact hole. The first interlayer dielectric layer 120 may also be referred to as a pre-metal dielectric (PMD) for differentiating it from a second interlayer dielectric layer to be described below.

Next, metal wires 130, 131, and 132 for electrical connection with the contact plugs 133, 134, and 135 may be formed over the first interlayer dielectric layer 120. The metal wires 130, 131, and 132 may be patterned at a predetermined interval to prevent the metal wires 130, 131, and 132 from contacting each other.

Figure 3:
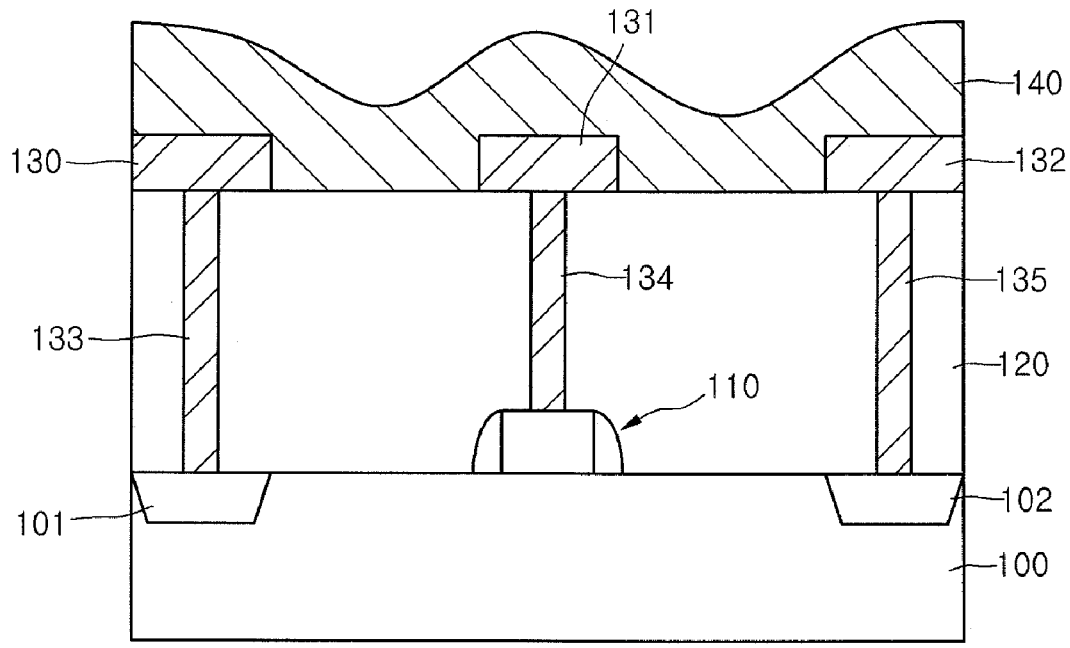

Referring to example FIG. 3, a phase change material layer 140 may be formed over the first interlayer dielectric layer 120 and the metal wires 130, 131, and 132. Herein, the phase change material layer 140 may be formed by a method such as CVD or PVD.

In addition, the phase change material layer 140 may be made of various kinds of materials such as GaSb, InSb, InSe, $Sb_2Te_3$, and GeTe combining two elements, GeSbTe, GaSeTe, InSbTe, $SnSb_2Te_4$, and InSbGe combining three elements, AgInSbTe, (GeSn)SbTe, GeSb(SeTe), and $Te_{81}Ge_{15}Sb_2S_2$ combining four elements, but made of a material having a property in which the volume thereof may be reduced.

In addition, as shown in the figure, the height of the phase change material layer 140 positioned vertically above the metal wires 130, 131, and 132 may be larger than that of the phase change material layer 140 formed over the first interlayer dielectric layer 120.

Figure 4:
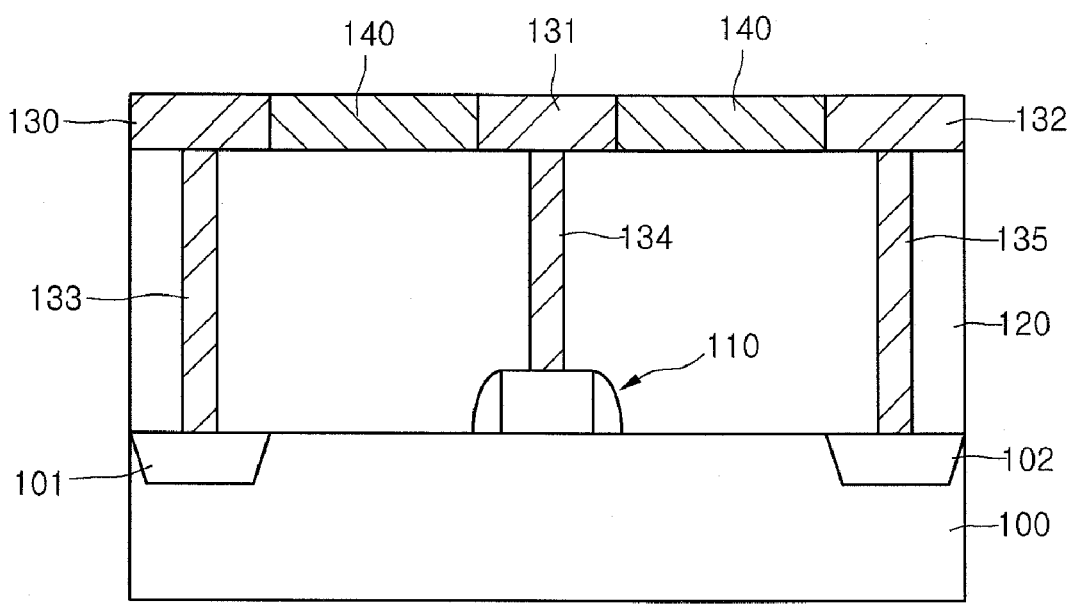

Next, referring to example FIG. 4, a process of planarizing the phase change material layer 140 may be performed. An etching process of the phase change material layer 140 may use a dry etching method and for example, may use $Cl_2$ gas or fluoride gas such as $C_xH_yF_z$, but is not limited thereto. Therefore, as shown in the figure, the phase change material layer 140 may be planarized so as to make the height of the phase change material layer 140 and those of the metal wires 130, 131, and 132 to be the same.

Figure 5:
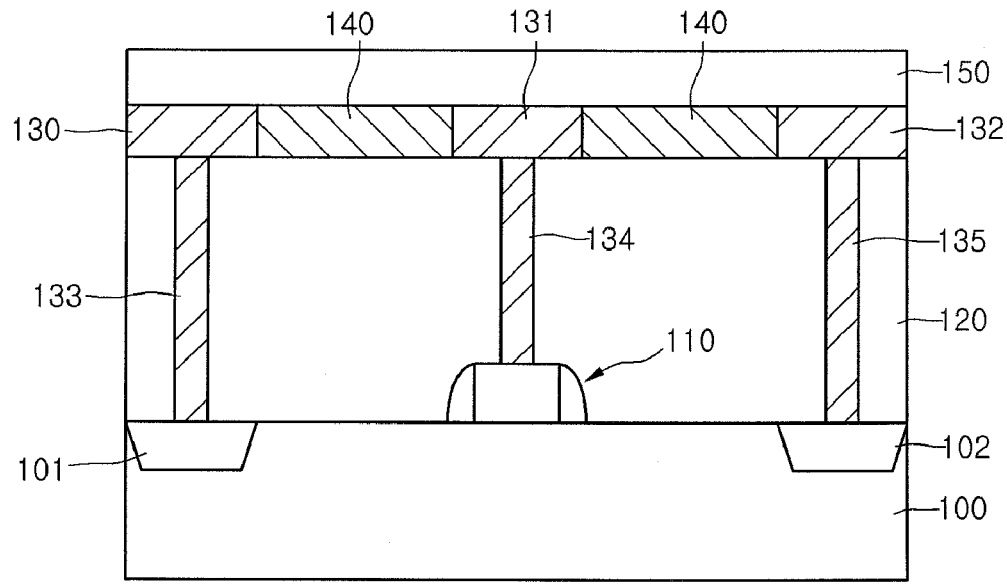

Next, referring to example FIG. 5, a second interlayer dielectric layer 150 may be formed over the metal wires 130, 131, and 132 and the phase change material layer 140. The second interlayer dielectric layer 150 may also be referred to as an interlayer metal dielectric (IMD) for differentiating it from the first interlayer dielectric layer 120.

Figure 6:
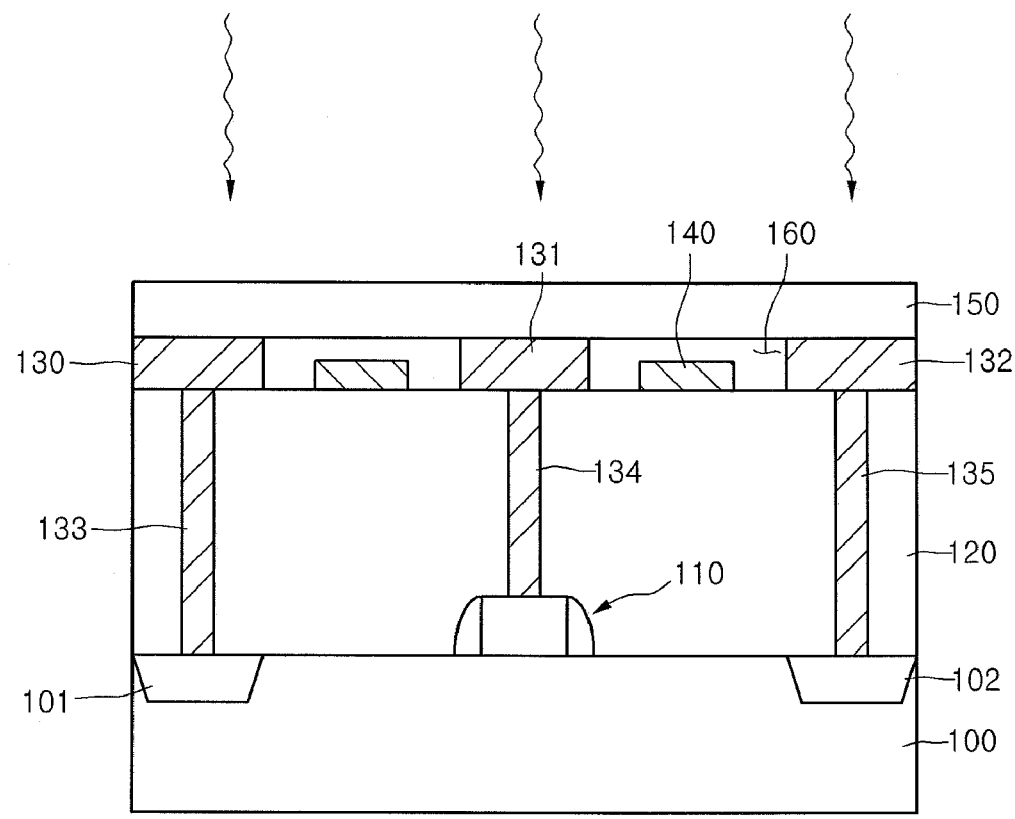

Referring to example FIG. 6, a thermal processing process for changing the phase of the phase change material layer 140 formed in an area between the metal wires 130, 131, and 132 may be performed. By the thermal processing process, the volume of the phase change material layer 140 may be reduced and as a result, as shown in the figure, a vacuum or air gap 160 may be formed.

That is, a predetermined air gap 160 is generated between the first metal wire 130 and the second metal wire 131. Another gap may also be formed between the second metal wire 131 and the third metal wire 132.

In a case where the interlayer dielectric layer is formed between metal wires, $\in = 4.0$. In a case of forming the air gap as described in embodiments, a value close to approximately 1.0 is shown.

For reference, since capacitance C may be expressed as $\in \in_0 A/d$, the capacitance C is proportional to a dielectric constant and inversely proportional to a distance d. That is, when a dielectric constant of a material is smaller, a dimension is smaller, and the distance is further, the value of the capacitance may be reduced and the RC delay may also be decreased. As a result, in embodiments in which the value of $\in$ decreases, the RC delay is remarkably reduced.

Accordingly, it is possible to reduce the RC delay of the semiconductor device by forming the air gap, dependent on the change of the phase of the phase change material in the area between the metal wires.

The semiconductor devices of embodiments are applicable to a broad range of semiconductor devices technologies and can be fabricated from a variety of semiconductor materials. The following description discusses embodiments of the semiconductor devices as implemented in silicon substrates, since the majority of currently available semiconductor devices are fabricated in silicon substrates and the most commonly encountered applications of embodiments will involve silicon substrates. Nevertheless, embodiments may also advantageously be employed in silicon on insulator (SOI), germanium, and other semiconductor materials. Accordingly, embodiments are not intended to be limited to those devices fabricated in silicon semiconductor materials, but will include those devices fabricated in one or more of the available semiconductor materials and technologies available to those skilled in the art, such as thin-film-transistor (TFT) technology using polysilicon on glass substrates.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   a first interlayer dielectric layer formed over a semiconductor substrate;
   a first metal wire and a second metal wire formed over the first interlayer dielectric layer;
   a second interlayer dielectric layer formed over the first and second metal wires;
   a phase change material layer formed between the first and second metal wires; and
   an air gap formed between the first interlayer dielectric layer and the second interlayer dielectric layer,
   wherein the air gap is formed to surround an upper surface and side surfaces of the phase change material layer.

2. The apparatus of claim 1, wherein the phase change material layer and the air gap are formed between the first metal wire and the second metal wire.

3. The apparatus of claim 1, wherein the air gap is in a vacuum state.

4. The apparatus of claim 1, wherein the first metal wire and the second metal wire are formed with an empty space interposed therebetween.

5. The apparatus of claim 1, wherein the phase change material layer is made of a material selected from GaSb, InSb, InSe, $Sb_2Te_3$, and GeTe.

6. The apparatus of claim 1, wherein the phase change material layer is made of a material selected from GeSbTe, GaSeTe, InSbTe, $SnSb_2Te_4$, and InSbGe.

7. The apparatus of claim 1, wherein the phase change material layer is made of a material selected from AgInSbTe, (GeSn)SbTe, GeSb(SeTe), and $Te_{81}Ge_{15}Sb_2S_2$.

8. The apparatus of claim 1, including contact plugs formed in the first interlayer dielectric layer.

9. The apparatus of claim 4, wherein the empty space is in the vacuum state.

10. The apparatus of claim 8, wherein the first and second metal wires are each connected to a contact plug.

* * * * *